United States Patent [19]

Kienel

[11] 4,161,560
[45] Jul. 17, 1979

[54] METHOD OF PRODUCING ANTIREFLECTIVE COATINGS ON ACRYLIC GLASSES, OPTICAL BODIES PRODUCED BY THIS METHOD AND THE USE OF SUCH OPTICAL BODIES

[75] Inventor: Gerhard Kienel, Hanau, Fed. Rep. of Germany

[73] Assignee: Leybold-Heraeus GmbH & Co. KG, Cologne, Fed. Rep. of Germany

[21] Appl. No.: 862,872

[22] Filed: Dec. 21, 1977

[30] Foreign Application Priority Data

Dec. 23, 1976 [DE] Fed. Rep. of Germany ....... 2658418

[51] Int. Cl.² .............................................. G02B 5/28
[52] U.S. Cl. .................................... 428/213; 350/164;
350/175 NG; 351/166; 427/164; 427/248 J;
428/432; 428/522
[58] Field of Search ............... 427/164, 165, 166, 167,
427/248 A, 248 B, 248 C, 248 E, 248 J, 296;
350/164, 165, 166, 175 NG; 351/166; 428/213,
214, 333, 432, 522

[56] References Cited

U.S. PATENT DOCUMENTS

| | | | |
|---|---|---|---|
| 3,934,961 | 1/1976 | Itoh et al. | 428/432 |
| 3,953,652 | 4/1976 | Addiss, Jr. | 427/164 |
| 3,984,581 | 10/1976 | Dobler et al. | 427/167 |
| 3,991,234 | 11/1976 | Chang et al. | 428/412 |

*Primary Examiner*—William J. Van Balen
*Attorney, Agent, or Firm*—Sprung, Felfe, Horn, Lynch & Kramer

[57] ABSTRACT

An optical body and a method of producing same comprising a transparent plastic substrate composed of an acrylate, preferably polymethylmethacrylate, depositing a first coat having a high refraction index on the substrate by vaporizing an oxide mixture of substantially zirconium dioxide with a content of 4 to 15 percent weight percent of aluminum oxide and depositing a second coat having a low refractive index by devaporization in a vacuum of a borosilicate glass containing less than 5 weight-percent of alkali metal oxides. The application of at least the first coat is performed in an oxidizing residual gas atmosphere.

7 Claims, 2 Drawing Figures

METHOD OF PRODUCING ANTIREFLECTIVE COATINGS ON ACRYLIC GLASSES, OPTICAL BODIES PRODUCED BY THIS METHOD AND THE USE OF SUCH OPTICAL BODIES

BACKGROUND OF THE INVENTION

The invention relates to a method of producing oxidic, antireflective coatings on transparent plastic substrates of the acrylic glass group, especially on sheets and lenses of polymethylmethacrylate, in which the substrate is vacuum coated with a first layer of high refractive index followed by a second layer of low refractive index.

The demand for stable antireflective coatings on transparent substrates has long existed. The fact that they increase transmission by about 8 to 10% is less important than the fact that they eliminate undesirable light reflections, which is especially important when the substrate in question is situated between an observer or viewer and an object. This is the case, for example, with the windshields of aircraft and motor vehicles and with eyeglass lenses. Especially in darkness, light rays coming from behing the observer and striking the substrate produce reflections which are several times brighter than the object being observed and they virtually blind the observer. The rays of the sun coming from behind and striking the glazing of a helicopter cockpit, or headlight beams striking the windshield of a car from behind, are examples of this situation. But even light rays coming from the direction of the object, that is, coming from ahead of the observer, produce undesirable reflections when, after passing through the substrate, they are reflected from behind, as for example from bright clothing or from the cornea of the human eye. The latter circumstance is especially important in the case of eyeglasses.

While the problem of the antireflective coating of inorganic substrates has been satisfied in a substantially satisfactory manner, the situation is still poor in the case of plastic substrates. The reason for this is to be found in the fact that, on the basis of physical laws, the index of refraction of the antireflective coating must be lower than the index of refraction of the substrate. This excludes a large number of oxidic materials from the production of antireflective coatings. Of the remaining materials, some are hard to vaporize, and in the case of others the substrate has to be heated to between 300° and 350° C. either during the vapor coating or subsequently thereto, in order to achieve the desired coating properties. Such substrate temperatures, however, cannot be applied to plastic substrates for obvious reasons. For example, magnesium fluoride, which can be used on inorganic substrates, cannot be used on plastic substrates, because microfissures occur in the coating, and the coating is removed by the sweat test. Furthermore, the single-layer coating does not produce a sufficient antireflective effect. The reasons for this are familiar to the average technical person. There is a decided tendency, therefore, to look for multi-layer or laminated systems.

In the book, "Die Fachvorträge des WVAO-Jahreskongresses 1973 in Berlin," published by the Wissenschaftliche Vereinigung für Augenoptik und Optometrie e.V., of Bad Godesberg, in connection with the antireflective treatment of plastic glasses and the above-mentioned physical laws with regard to the indices of refraction, it is recommended that first a coating having a higher refractive index of about n=2 be applied, followed by a silicate coating. The following are given as required characteristics of the coating:

(a) Low reflection at the maximum light sensitivity of the eye;
(b) Freedom from absorption;
(c) Strength of adhesion;
(d) Hardness;
(e) Resistance to chemicals, sweat and fungi;
(f) Resistance to wiping (scratch resistance);
(g) Temperature stability;
(h) Low aging effect.

It has been found that, in the coatings on plastic glasses which are described therein, do have a temperature stability up to about 90° to 100° C., but only under dry conditions, not, for example, in the sweat test.

For example, the attempt has been made to improve the teaching of the above-cited literature by vacuum coating the substrate first with a high-refraction layer of titanium dioxide and then with a second, low-refraction layer of magnesium fluoride. However, it has been found that the second layer is easily removed during the sweat test and upon heating, while the first layer usually remains intact. This layer alone, however, does not fulfill the purpose of producing a great reduction of reflection. Cryolite could also serve for the second layer with regard to the refractive index, but its hygroscopicity precludes its use.

It has furthermore been found that plastics display widely varying behavior under vapor coating conditions. This applies, for example, with regard to their surface qualities before and after any necessary glow discharge treatment, and with regard to the condensation of monomers etc., and thus also to the strength of adhesion. Also the aging behavior during the later use of the vapor coated objects differs entirely from one plastic to another. Lastly, even the refractive index, which determines the optical properties in conjunction with thin coatings, and the thermal expansion coefficient and modulus of elasticity, which are important to mechanical strength, differ greatly. For each plastic or for each group of plastics, therefore, a tailored-to-measure vapor coating process must be developed, especially when the plastic involved must comply with special requirements having no connection with the coating, such as for example resistance to shattering, etc.

SUMMARY OF THE INVENTION

The invention is therefore addressed to the problem of devising a method of preparing antireflective coatings on acrylic glasses, especially on polymethylmethacrylate, which will result in coatings which will largely fulfill the above-stated requirements in every respect.

This problem is solved for the above-specified plastics in accordance with the invention in that the first coating is deposited by vaporizing an oxide mixture of essentially $ZrO_2$ with a content of 4 to 15% by weight of $Al_2O_3$, and the second coating by vaporizing a borosilicate glass containing less than 5 weight-percent of alkali metal oxides, the vaporizing of at least the first coat being performed in an oxidizing residual gas atmosphere.

The statement that the oxide mixture consists essentially of $ZrO_2$ is to be understood to mean that the oxide mixture consists essentially of $ZrO_2$. The presence of other oxides is not excluded however all that is required is a content of 4 to 15 weight-percent of $Al_2O_3$. An especially suitable borosilicate glass is sold, for example, by Schott und Gen. of Mainz under Glass Number 8329. Another suitable borosilicate glass is specified in German Pat. No. 1,934,217. This is a glass which is easily vaporizable in a vacuum by means of electron beams, and its content of alkali metal oxides is kept below 4 weight-percent in order to prevent sputtering upon vaporization. The small content of aluminum oxide that is simultaneously required is especially favorable to vaporization by electron beams.

Vapor depositing in an oxidizing residual gas atmosphere—which can be produced, for example, by reducing the pressure appropriately and then admitting pure oxygen until the desired vacuum level is established—compensates the tendency of zirconium oxide to decompose.

It has surprisingly been found that, if the specified parameters are maintained, a reflection-reducing double layer system is produced which has excellent stability in all tests and can be applied in a repeatable manner from a vapor with a good degree of uniformity as regards the coating thickness distribution, even on substantially larger substrate surfaces than eyeglass lenses, for example. Such coatings have shown excellent stability in the sweat test of DIN 50017. In these tests the substrates are exposed for 8 hours to a temperature of 40° C. and an atmospheric humidity of about 100%, and then for 16 hours to normal atmospheric conditions. This cycle is repeated a number of times. The coatings proved to be outstandingly stable even in the salt fog test of DIN 50021, wherein the substrates are situated in a chamber in which, at a temperature of 35° C., a fog of water is produced which has a content of 5%, by weight, of sodium chloride. The coatings also withstood the test known as the "Tesafilm Test" in which an attempt is made to pull the coating away perpendicularly from the surface of the substrate by means of a self-adhesive tape. As regards optical properties of the coating, the first layer is virtually absorption-free, although it was deposited on an unheated substrate. With regard to the antireflective spectrum it was found that the reflection curve becomes broader in the visible light range than it is in a coating of pure $ZrO_2$. The strength of the residual reflection is thus diminished. With respect to the vaporizing properties it can be stated that the oxide mixture can be vaporized by an electron beam more easily and at a more constant vaporization rate than pure $ZrO_2$.

The two individual coatings are generally deposited in a thickness of a quarter wavelength each, with respect to the wavelength of visible light for which the human eye has the greatest sensitivity. By means of two quarter-wavelength layers it is possible by the method of the invention to achieve a residual reflectivity of almost 0% for a specific wavelength. It is possible to shift the reflection minimum to other wavelengths, thereby influencing the color characteristic. If the first layer is reduced in thickness, e.g., to a thickness of about a twelfth of a wavelength, and the application of the second, borosilicate glass coating is continued until the reflectivity is reduced to a minimum, the reflection minimum will not be as low, but the antireflection spectrum will be wider.

The subject of the invention has proven to be especially well suited for use in aircraft windows, especially for the internal and external coating of the glazing of helicopter cockpits.

DETAILED DESCRIPTION OF THE INVENTION

Figure 1:
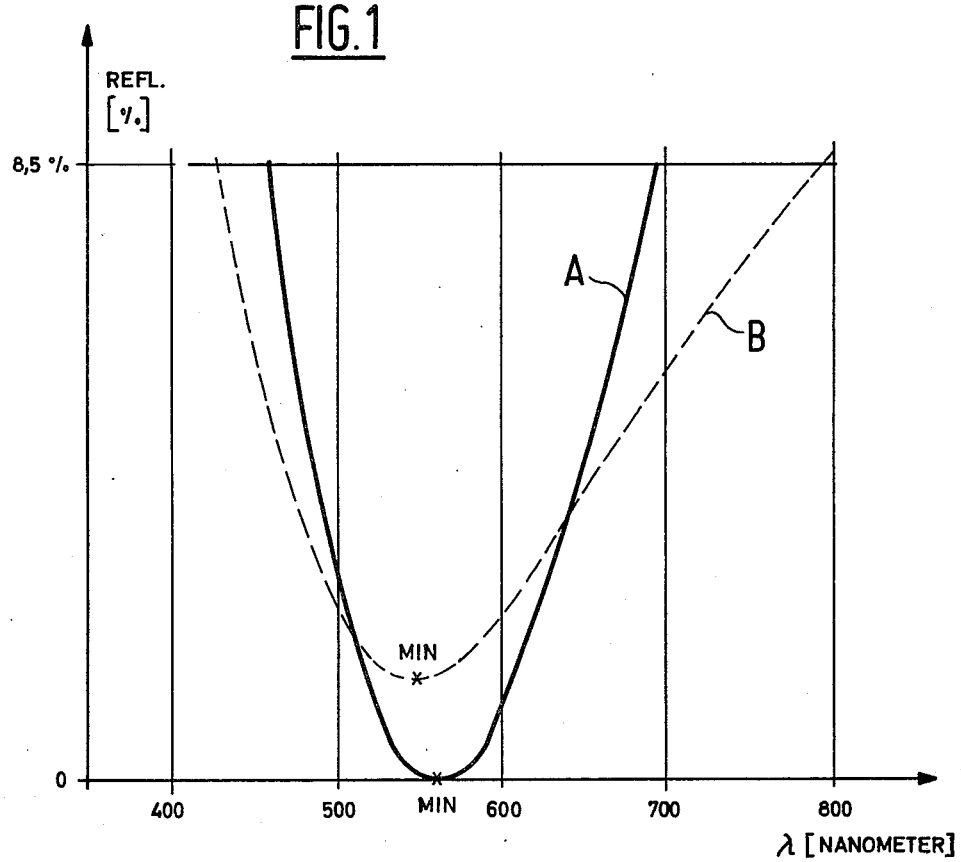
FIG. 1 is a graph of the antireflection characteristic of the present invention and FIG. 2 is a cross-sectional view of the coated substrate.
Figure 2:
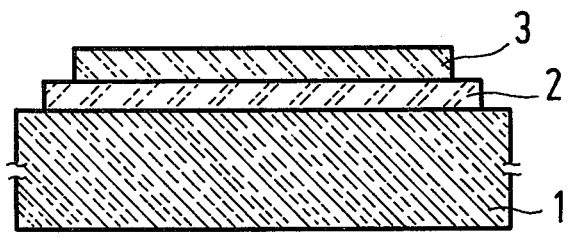

Referring now to FIGS. 1 and 2, the optical body of the invention includes the substrate 1, the higher refractive index coating 2 of $ZrO_2$ thereon and the lower refractive index coating 3 of borosilicate glass disposed on coating 2.

FIG. 1 illustrates the antireflection curve of the optical body shown in FIG. 2, with the specifics set forth in the following Examples.

EXAMPLES

EXAMPLE 1

In a vertical apparatus having a chamber diameter of 700 mm, four substrates measuring $200 \times 150 \times 4$ mm$^3$, made from polymethylmethacrylate No. 245 of Josef Weiss, Plastik KG, Munich, were suspended from a dome-shaped substrate holder. The apparatus was evacuated down to a pressure of $2 \times 10^{-5}$ Torr, and then the pressure was raised again to $10^{-1}$ Torr by letting in air through a needle valve, and a glow discharge of two minutes' duration was performed for purification, using a sector cathode with simultaneous relative movement between the sector cathode and the substrates. The glow discharge power amounted to 0.2 Watts per cm$^2$ of cathode area. When the glow discharge had been completed, the apparatus was again evacuated to $2 \times 10^{-5}$ Torr, and pure oxygen was admitted to a pressure of $1 \times 10^{-4}$ Torr. A mixture of 94 weight-percent of $ZrO_2$ and 6 weight-percent of $Al_2O_3$ was vaporized from one bowl of the water-cooled crucible of an electron beam vaporizer until a coating thickness of a quarter wavelength was achieved at a photometer wavelength of 550 nanometers. The vaporization rate was adjusted so that the vapor coating time extended over a period of 4 minutes. Then the oxygen feed was shut off, and from another bowl of the same vaporizer granules of borosilicate glass No. 8329 Schott und Genossen of Mainz were vaporized to form a second coating having a quarter wavelength thickness at a photometer wavelength of 550 nm. The reaching of this thickness was determined using monochromatic light and a conventional photometer. When it is reached, the reflectivity of the coating has a minimum value.

The coated substrate was then subjected to the sweat test of DIN 50017 and to the salt fog test of DIN 50021. No damage visible to the naked eye was done. The Tesafilm or Scotch Tape test resulted in no damage to the coating. The measurement of the optical properties was performed with a measuring apparatus system Model DK2A of Beckmann Instruments over a wavelength range between 400 and 800 nanometers. The antireflection curve is represented at A in FIG. 1. It can be seen that curve A virtually reaches the zero line at about 550 nanometers. The build-up of the coating was accomplished in the sequence represented in FIG. 2, where 1* is the polymethylmethacrylate substrate, 2* the first layer of $ZrO_2$ containing 6% of $Al_2O_3$ and 3 the second or cover layer of borosilicate glass of the composition described above.

EXAMPLE 2

The experiment of Example 1 was repeated, except that the first layer was deposited to a thickness of only one twelfth of a wavelength and the application of the second layer was performed until the reflectivity of the system had reached a minimum. The mechanical and chemical characteristics of the coating do not differ measurably from the results of Example 1. The optical characteristics are represented by curve B in FIG. 1. The reflectivity minimum is again at about 550 nanometers, and it does not reach the zero line, yet the curve outside of the minimum is flatter than curve A, i.e., the antireflectivity range is broader.

What is claimed is:

1. A method of producing a three layer antireflective transparent article, comprising: providing a transparent plastic substrate from the group of the acrylic glasses of polymethylmethacrylate to define the first layer; depositing a first coat on the substrate having a high refractive index by vaporizing an oxide mixture of substantially $ZrO_2$ with a content of 4 to 15 weight-percent of $Al_2O_3$ to define the second layer; and depositing a second coat on the first coat having a low refractive index by the vaporization in a vacuum of a borosilicate glass containing less than 5 weight-percent of alkali metal oxides, to define the third layer wherein the application of at least the first coat is performed in an oxidizing residual gas atmosphere.

2. The method according to claim 1, wherein the first and second coats are applied with a coat thickness of $\lambda/4$ each, with respect to the wavelength of visible light for which the human eye has the maximum sensitivity.

3. The method according to claim 1, wherein the first coat is applied with a coat thickness of about $\lambda/12$ with respect to the wavelength of visible light for which the human eye has the maximum sensitivity, and that the material of the second coat is applied until the reflection has a minimum value.

4. A three layer antireflective transparent optical body, comprising: a substrate composed of an acrylate, polymethylmethacrylate to define the first layer; a first coating on the substrate composed of an oxide mixture of substantially $ZrO_2$ having a content of 4 to 15 weight-percent of $Al_2O_3$ and having a first refractive index to define the second layer; and a second coating of a borosilicate glass superposed on the first coating and containing less than 5 weight-percent of alkali metal oxides and having a second refractive index less than said first refractive index to define the third layer.

5. An optical body according to claim 4, wherein the first coating is applied by vaporizing the oxide mixture and the second coating is applied by vaporization in a vacuum and wherein at least the first coating is applied in an oxidizing residual gas atmosphere.

6. An aircraft window comprising the optical body of claim 4.

7. An optical lens comprising the optical body of claim 4.

* * * * *